United States Patent
Zhan et al.

(10) Patent No.: US 11,101,361 B1
(45) Date of Patent: Aug. 24, 2021

(54) GATE-ALL-AROUND (GAA) TRANSISTOR AND METHOD OF FABRICATING THE SAME

(71) Applicant: UNITED MICROELECTRONICS CORP., Hsin-Chu (TW)

(72) Inventors: Zhaoyao Zhan, Singapore (SG); Qianwei Ding, Singapore (SG); Xiaohong Jiang, Singapore (SG); Ching Hwa Tey, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/886,744

(22) Filed: May 28, 2020

(51) Int. Cl.
| | |
|---|---|
| *H01L 29/423* | (2006.01) |
| *H01L 29/06* | (2006.01) |
| *H01L 29/417* | (2006.01) |
| *H01L 29/786* | (2006.01) |
| *H01L 21/02* | (2006.01) |
| *H01L 21/762* | (2006.01) |
| *H01L 29/66* | (2006.01) |
| *H01L 29/76* | (2006.01) |
| *H01L 29/16* | (2006.01) |
| *H01L 29/24* | (2006.01) |

(52) U.S. Cl.
CPC .. *H01L 29/42392* (2013.01); *H01L 21/02603* (2013.01); *H01L 21/76267* (2013.01); *H01L 21/76283* (2013.01); *H01L 29/0649* (2013.01); *H01L 29/0673* (2013.01); *H01L 29/41733* (2013.01); *H01L 29/66045* (2013.01); *H01L 29/78696* (2013.01); *H01L 21/02527* (2013.01); *H01L 21/02568* (2013.01); *H01L 29/1606* (2013.01); *H01L 29/24* (2013.01); *H01L 29/66969* (2013.01); *H01L 29/7606* (2013.01)

(58) Field of Classification Search
CPC ......... H01L 21/02104; H01L 21/02527; H01L 21/02518; H01L 21/02568; H01L 21/02587; H01L 21/02603; H01L 21/762; H01L 21/76267; H01L 21/76283; H01L 21/8232; H01L 21/823412; H01L 21/823431; H01L 21/823807; H01L 21/823821; H01L 29/0649; H01L 29/0665; H01L 29/0669; H01L 29/0673; H01L 29/1606; H01L 29/24; H01L 29/41; H01L 29/413; H01L 29/41733; H01L 29/4232; H01L 29/42392; H01L 29/66045; H01L 29/66969; H01L 29/7606; H01L 29/78; H01L 29/786; H01L 29/78696
See application file for complete search history.

(56) References Cited

U.S. PATENT DOCUMENTS

| | | |
|---|---|---|
| 6,350,703 B1 | 2/2002 | Sakaguchi |
| 8,692,229 B2 | 4/2014 | Cohen |
| 10,388,732 B1 | 8/2019 | Frougier |
| 2020/0357703 A1* | 11/2020 | Lee .................. H01L 21/02603 |

* cited by examiner

*Primary Examiner* — Cheung Lee
(74) *Attorney, Agent, or Firm* — Winston Hsu

(57) ABSTRACT

A GAA transistor includes a semiconductor substrate. A first shallow trench isolation (STI) is embedded in the semiconductor substrate. A top surface of the first STI is lower than a top surface of the semiconductor substrate. A nanowire crosses the first STI and is disposed on the first STI. A gate structure contacts and wraps around the nanowire. A source electrode contacts a first end of the nanowire. A drain electrode contacts a second end of the nanowire.

20 Claims, 11 Drawing Sheets

A-A'

GATE-ALL-AROUND (GAA) TRANSISTOR AND METHOD OF FABRICATING THE SAME

BACKGROUND OF THE INVENTION

1. Field of the Invention

The present invention relates to a gate-all-around (GAA) transistor and method of fabricating the same, and more particularly to a GAA transistor with a fine semiconductor channel suspended on a recessed trench isolation such as a shallow trench isolation (STI) and method of fabricating the same.

2. Description of the Prior Art

Planar transistor technologies have evolved in accordance with Moore's law toward denser designs. Traditionally, this evolution has been achieved by scaling the dimensions of the individual transistors and associated parameters to accommodate the increasing densities. However, reduction of transistor size is limited by the practicalities of reliable fabrication techniques for achieving practical yield as well as intrinsic device performance barriers arising from the underlying physics of such devices at small scales.

In order to overcome the scaling barriers for planar classical devices, research has focused on 3D designs such as the FINFET, or GAA transistors. A GAA transistor is configured to use one or more nanowires to serve as channel, source and drain regions, which provides the gate region an increased controls over the channel region because the transistor can be controlled by a 3D gate region.

However, a conventional fabricating process of a GAA transistor requires a complicated process.

SUMMARY OF THE INVENTION

In view of this, the present invention provides a novel method of fabricating a GAA transistor.

According to a preferred embodiment of the present invention, a GAA transistor includes a semiconductor substrate. A first STI is embedded in the semiconductor substrate. A top surface of the first STI is lower than a top surface of the semiconductor substrate. A nanowire crosses the first STI and is disposed on the first STI. A gate structure contacts and wraps around the nanowire. A source electrode contacts a first end of the nanowire. A drain electrode contacts a second end of the nanowire.

According to another preferred embodiment of the present invention, a fabricating method of a GAA transistor includes providing a semiconductor substrate with a first STI and a second STI embedded therein, wherein the first STI is parallel to the second STI and the first STI is next to the second STI. Later, a material layer is formed to contact the semiconductor substrate, the first STI and the second STI. Next, the material layer is patterned to form a nanowire crossing the first STI and disposed on the first STI and to remove the material layer on the second STI. Subsequently, a dummy gate structure and two spacers at two sides of the dummy gate structure are formed. The dummy gate structure and the two spacers cross and contact the nanowire, and the dummy gate structure and the two spacers entirely overlap the first STI. Later, a source electrode and a drain electrode are formed. The source electrode contacts a first end of the nanowire, and the drain electrode contacts a second end of the nanowire. Then, the dummy gate structure is removed and the first STI is exposed. Afterwards, the first STI is recessed to make a top surface of the first STI lower than a top surface of the semiconductor substrate, wherein while recessing the first STI, the second STI is not recessed. Finally, a gate structure is formed in the gap between nanowire and the STI beneath to contact and wrap around the nanowire.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 2A, FIG. 2B, FIG. 3, FIG. 4A, FIG. 4B, FIG. 6, FIG. 7A, FIG. 7B, FIG. 7C, FIG. 8A, FIG. 8B, FIG. 9A, FIG. 9B, FIG. 10, FIG. 15 and FIG. 16 schematically depict a fabricating method of a GAA transistor according to a first preferred embodiment of the present invention, wherein:

FIG. 1 depicts a three-dimensional diagram of a substrate with a silicon oxide layer embedded therein according to a first preferred embodiment of the present invention;

FIG. 2A is a fabricating step in continuous from FIG. 1;

FIG. 2B is a sectional view taken along line A-A' in FIG. 2A;

FIG. 3 is a fabricating step in continuous from FIG. 2A;

FIG. 4A is a fabricating step in continuous from FIG. 3;

FIG. 4B is a sectional view taken along line B-B' in FIG. 4A;

FIG. 6 is a fabricating step in continuous from FIG. 4A;

FIG. 7A is a fabricating step in continuous from FIG. 6;

FIG. 7B is a sectional view taken along line C-C' in FIG. 7A;

FIG. 7C is a varied type of FIG. 7B;

FIG. 8A is a fabricating step in continuous from FIG. 7A;

FIG. 8B is a sectional view taken along line D-D' in FIG. 8A;

FIG. 9A is a fabricating step in continuous from FIG. 8A;

FIG. 9B is a sectional view taken along line E-E' in FIG. 9A;

FIG. 15 is a sectional view taken along line F-F' in FIG. 9A;

FIG. 16 is a varied type of FIG. 15 according to another embodiment; and

FIG. 10 is a fabricating step in continuous from FIG. 9B.

DETAILED DESCRIPTION

FIG. 1, FIG. 2A, FIG. 2B, FIG. 3, FIG. 4A, FIG. 4B, FIG. 6, FIG. 7A, FIG. 7B, FIG. 7C, FIG. 8A, FIG. 8B, FIG. 9A, FIG. 9B, FIG. 10, FIG. 15 and FIG. 16 schematically depict a fabricating method of a GAA transistor according to a first preferred embodiment of the present invention.

Figure 1:
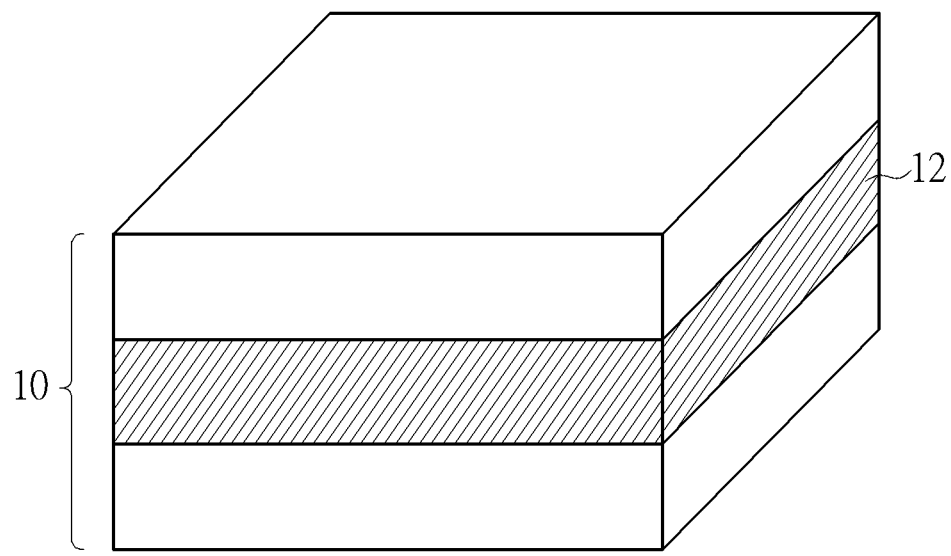

As shown in FIG. 1, a substrate 10 is provided. The substrate 10 may be a semiconductor substrate or silicon on insulator (SOI) substrate. The semiconductor substrate includes a bulk silicon substrate, a germanium substrate, a gallium arsenide substrate, a silicon germanium substrate, an indium phosphide substrate, or a silicon carbide substrate, but is not limited to these. This embodiment demonstrates the substrate 10 as a semiconductor substrate. Please still refer to FIG. 1, an ion implantation process is performed to implant oxygen ions into the substrate 10 followed by a thermal anneal process to form an isolation layer 12 embedded in the substrate 10. The isolation layer 12 could be oxides or nitrides of the substrate and/or mixture of them. According to a preferred embodiment of the present invention, the isolation layer 12 is silicon oxide. If the substrate 10 is an SOI substrate, the ion implantation process and the thermal anneal process can be omitted.

Figure 2A:
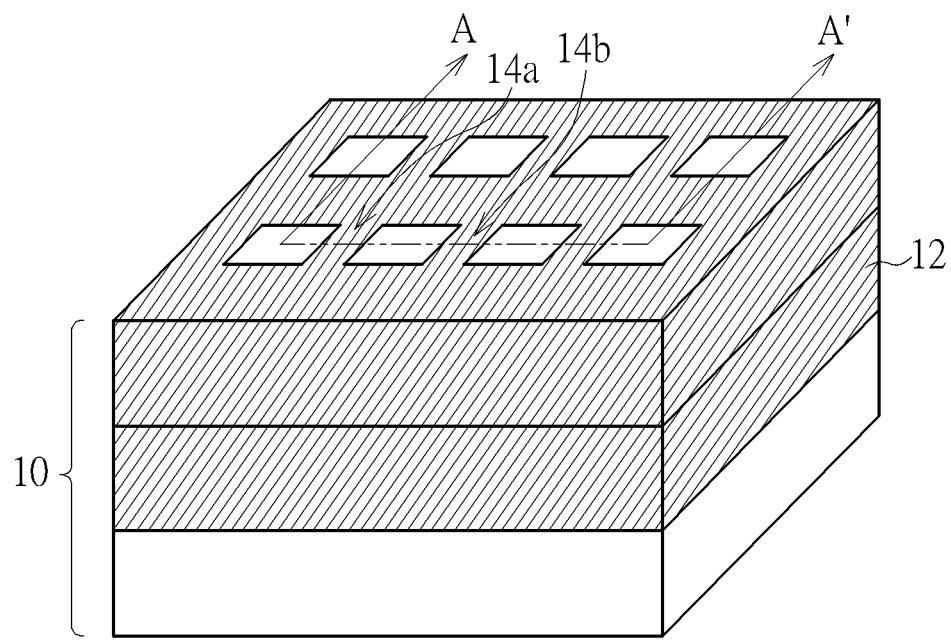
Figure 2B:
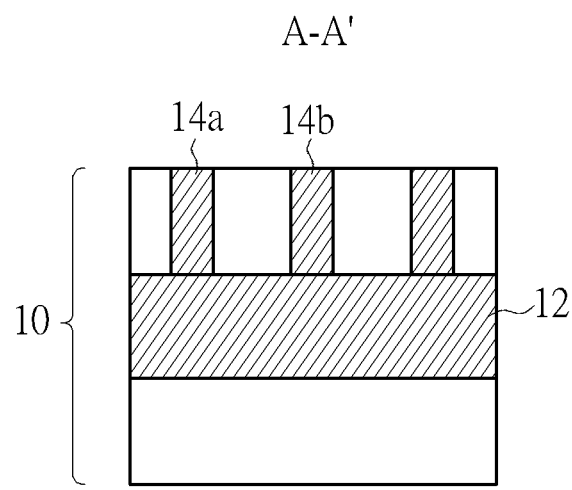

FIG. 2A is a fabricating step in continuous from FIG. 1. As shown in FIG. 2A, the substrate 10 is etched to form multiple trenches in the substrate 10. Later, a shallow trench isolation (STI) filling fills in the trenches to form multiple STIs in the substrate 10. The STI filling is preferably silicon oxide. FIG. 2B is a sectional view taken along line A-A' in FIG. 2A. As shown in FIG. 2B, the multiple STIs may include a first STI 14a and a second STI 14b formed in the substrate 10. The second STI 14b is next to the first STI 14a.

Figure 3:
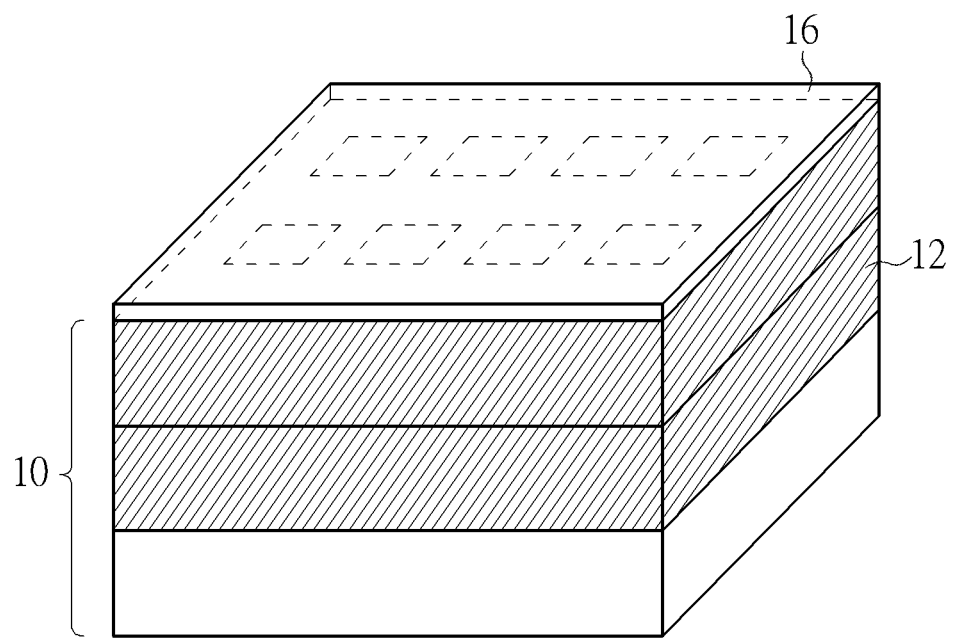

FIG. 3 is a fabricating step in continuous from FIG. 2A. As shown in FIG. 3, a material layer 16 is formed to contact the substrate 10. The material layer 16 can be a layer of semiconductor film or a layer of two dimensional (2D) material. The semiconductor could include silicon, germanium silicon germanium, carbon or silicon carbide, and other semiconductor materials. The 2D material includes but is not limited to graphene, silicene, germanene, stanene, black phosphorus, borophene, h-BN, MXenes, transition metal oxides (TM oxides), transitional metal hydroxides, or transition metal dichalcogenide (TMDs). Exemplary transition metal dichalcogenides include, but are not limited to, molybdenum disulphide ($MoS_2$), hafnium disulfide ($HfS_2$), zirconium disulfide ($ZrS_2$), tungsten disulfide ($WS_2$), tin sulfide (SnS), or tungsten diselenide ($WSe_2$). The material layer 16 can be formed by a deposition process, an epitaxial growth process or a transfer process.

Figure 4A:
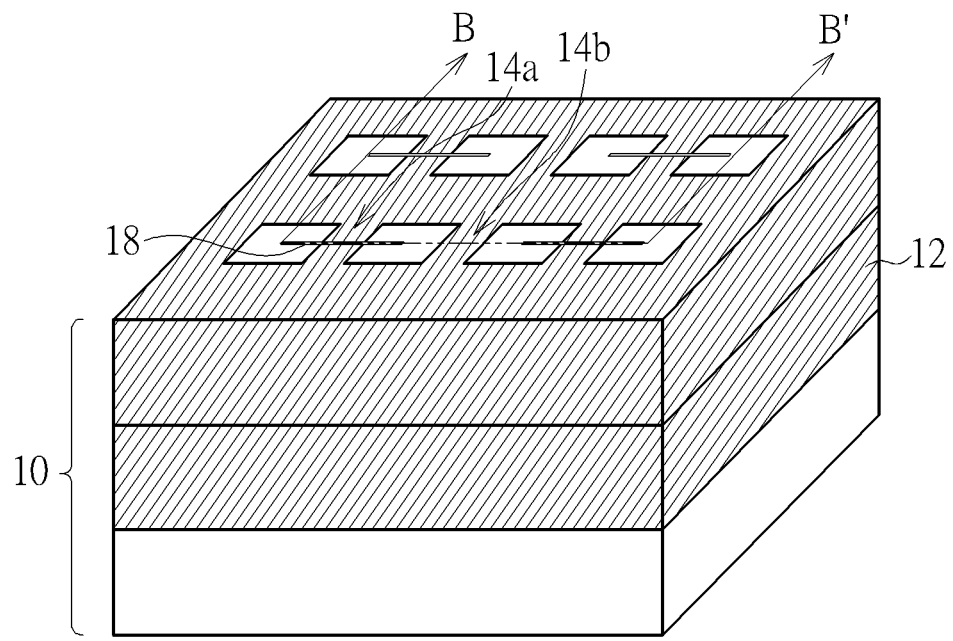
Figure 4B:
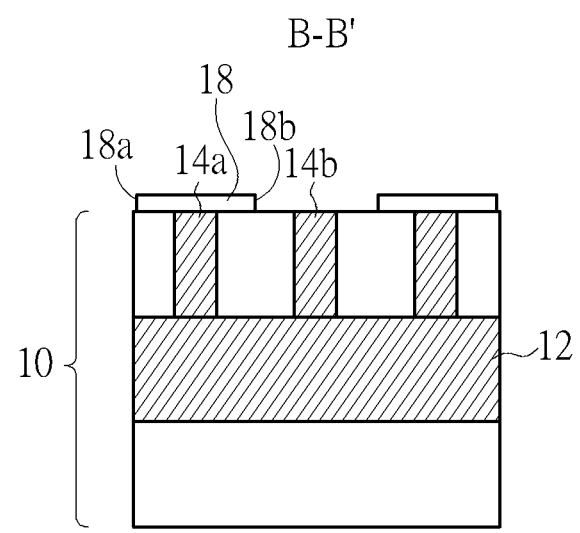
Figure 5:
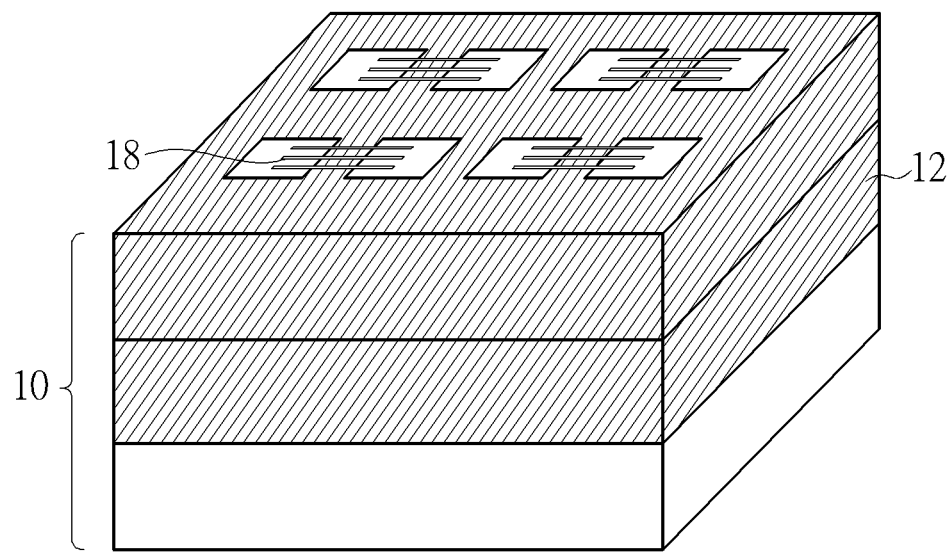
FIG. 5 is a fabricating step in continuous from FIG. 3 according to a second preferred embodiment of the present invention.

FIG. 4A is a fabricating step continuing from FIG. 3. FIG. 4B is a sectional view taking along line B-B' in FIG. 4A. As shown in FIGS. 4A and 4B, the material layer 16 is patterned to form a nanowire 18 crossing the first STI 14a and disposed on the first STI 14a. The material layer 16 on the second STI 14b is entirely removed while patterning. In other words, the nanowire 18 is formed on alternate STIs. As shown in FIG. 5, according to a second preferred embodiment of the present invention, the material layer 16 can be patterned into multiple nanowires 18 disposed on the first STI 14a. Similarly, there is no nanowire 18 on the second STI 14b. According to yet another embodiment of the present invention, the material layer 16 can also be patterned into nanosheets with wider channels.

Figure 6:
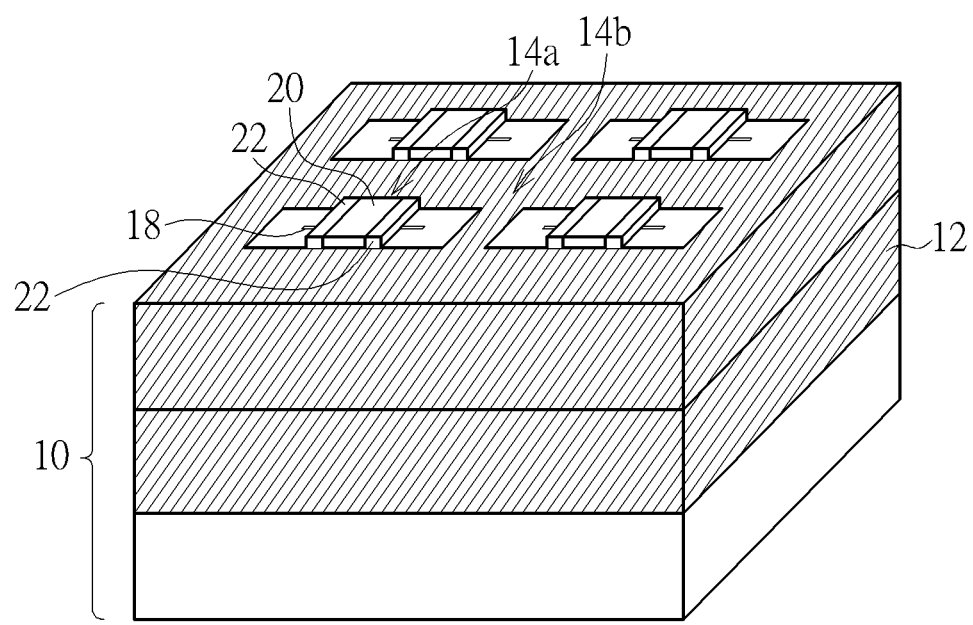

FIG. 6 is a fabricating step continuing from FIG. 4A. As shown in FIG. 6, a dummy gate structure 20 and two spacers 22 at two sides of the dummy gate structure 20, wherein the dummy gate structure 20 and the two spacers 22 are formed to cross and contact the nanowire 18. The dummy gate structure 20 and two spacers 22 may be formed by the same material at the same time; therefore, the fabricating steps can be decreased comparing to the conventional fabricating method of the dummy gate structure and spacers. In this case, the dummy gate structure 20 and two spacers 22 can be seen as a monolithic structure. For example, the dummy gate structure 20 and two spacers 22 can be formed by the same silicon nitride layer. In another case, the dummy gate structure 20 and two spacers 22 can be formed by two different materials based on different product requirements. For example, the dummy gate structure 20 can be formed by polysilicon or amorphous silicon and two spacers 22 can be formed by silicon nitride.

Figure 7A:
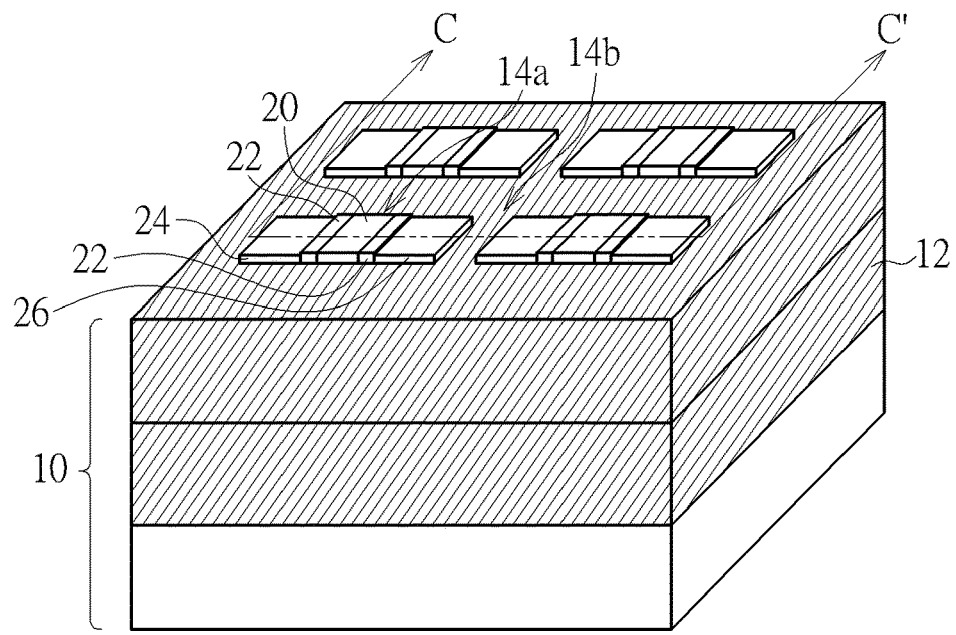
Figure 7B:
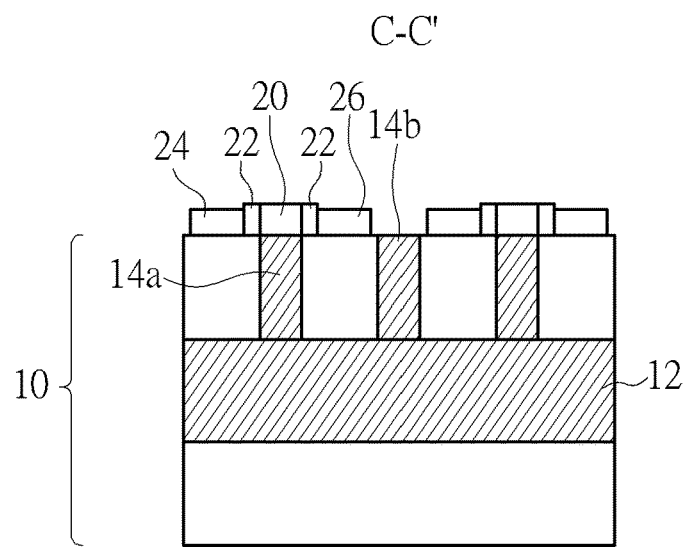

FIG. 7A is a fabricating step continuing from FIG. 6. FIG. 7B is a sectional view taking along line C-C' in FIG. 7A. As shown in FIG. 7A and FIG. 7B, a source electrode 24 and a drain electrode 26 are formed. The source electrode 24 contacts a first end 18a of the nanowire 18, and the drain electrode 26 contacts a second end 18b of the nanowire 18. Please see FIG. 4B for the position of the first end 18a and the second end 18b of the nanowire 18. The source electrode 24 and the drain electrode 26 can be metals, alloys or other conductive materials. Before forming the source electrode 24 and the drain electrode 26, a hard mask (not shown) or a photoresist (not shown) may be formed to cover the dummy gate structure 20, the spacers 22, the second STI 14b, and exposing the substrate 10 where the source electrode 24 and the drain electrode 26 to be formed. Then, a deposition process is performed to form the source electrode 24 and the drain electrode 26 on the nanowire 18. Later, the hard mask or the photoresist is removed.

Figure 8A:
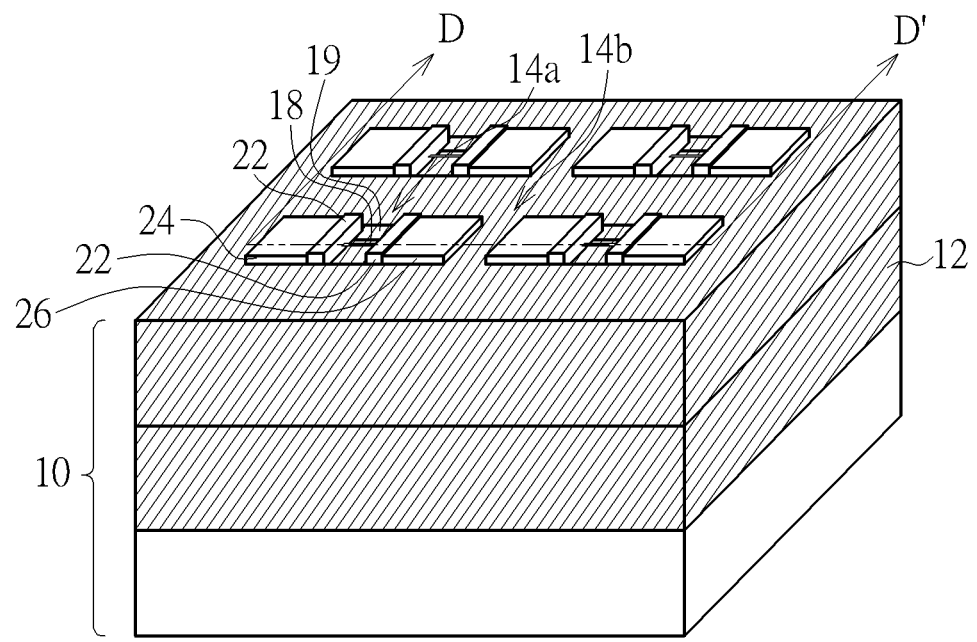
Figure 8B:
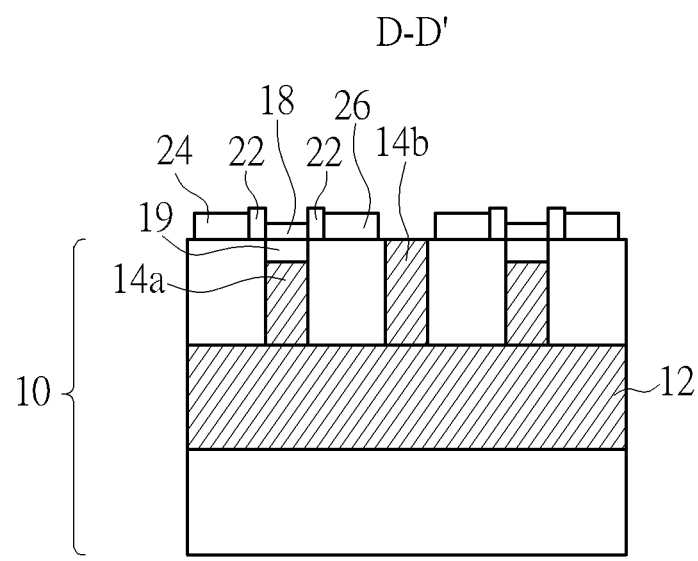

FIG. 8A is a fabricating step continuing from FIG. 7A. FIG. 8B is a sectional view taking along line D-D' in FIG. 8A. As shown in FIG. 8A and FIG. 8B, the dummy gate structure 20 is removed, and the first STI 14a and the middle of the nanowire 18 is exposed. Later, the first STI 14a is recessed to make a top surface of the first STI 14a lower than a top surface of the substrate 10. It is noteworthy that while recessing the first STI 14a, the second STI 14b is not recessed. The steps of removing the dummy gate structure 20 and recessing the first STI 14a may include forming a hard mask (not shown) or a photoresist (not shown) covers the spacers 22, the source electrode 24, the drain electrode 26, and the second STI 14b. Then, phosphoric acid is used as an etching solution to remove the dummy gate structure 20 if it is made of silicon nitride layer. In another embodiment that the dummy gate structure 20 is made of polysilicon or amorphous silicon, tetramethylammonium hydroxide (TMAH) or ammonium hydroxide ($NH_4OH$) can be used as the etching solution. After that, dilute hydrofluoric acid (DHF) is used as an etching solution to remove part of the first STI 14a. Because DHF only removes silicon oxide, therefore, the substrate 10 serves as a lateral stop layer to keep DHF only removed the first STI 14a. The nanowire 18 is suspended and a gap 19 is formed between the nanowire 18 and the first STI 14a. Later, the hard mask or the photoresist is removed.

Figure 9A:
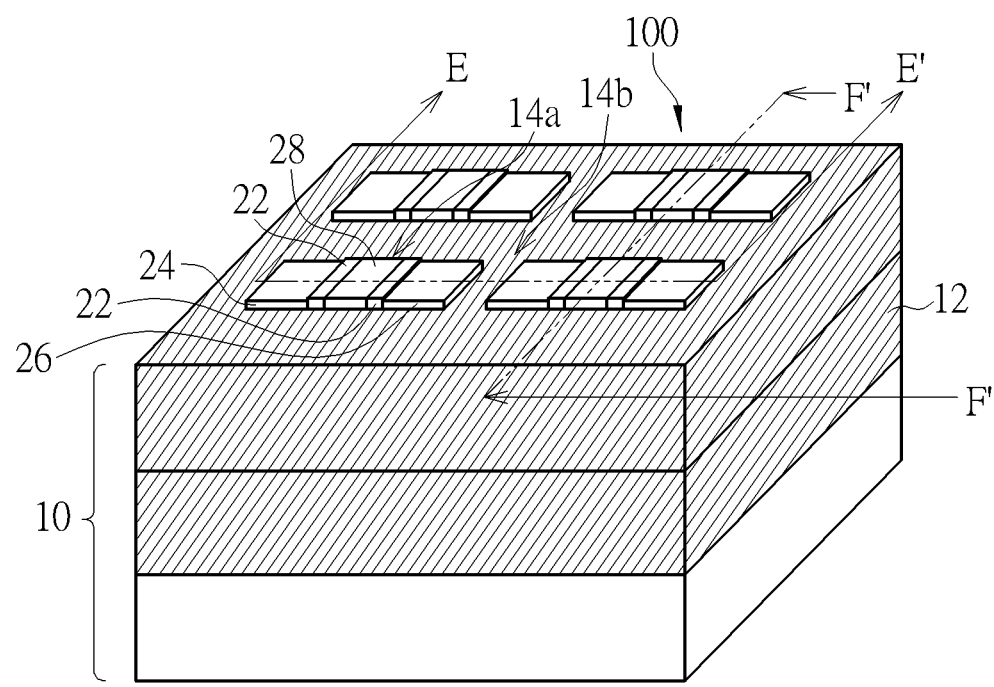
Figure 9B:
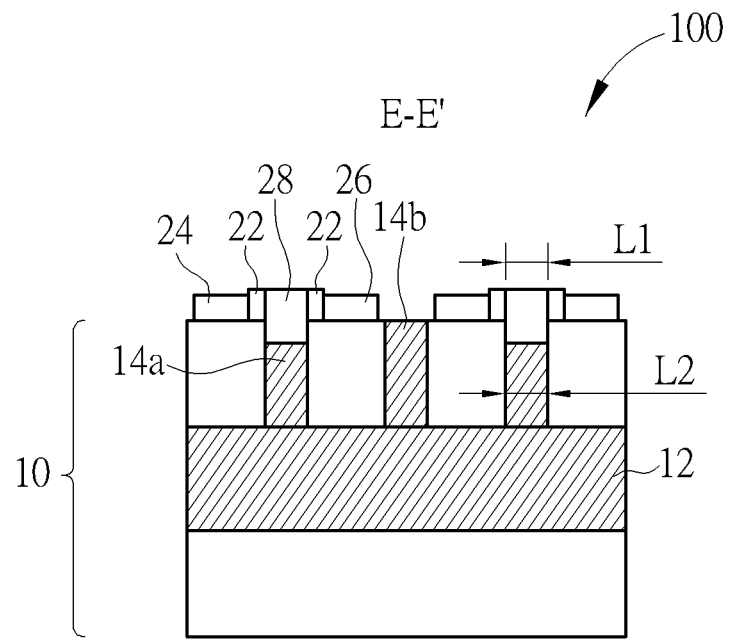

FIG. 9A is a fabricating step continuing from FIG. 8A. FIG. 9B is a sectional view taking along line E-E' in FIG. 9A. As shown in FIG. 9A and FIG. 9B, a gate structure 28 is formed to contact and wrap around the nanowire 18. The gate structure 28 may include a high-k dielectric and a metal gate. The gate structure 28 contacts the top surface of the first STI 14a. Therefore, part of the gate structure 28 is lower than the top surface of the substrate 10. Now, a GAA transistor 100 of the present invention is completed.

Figure 10:
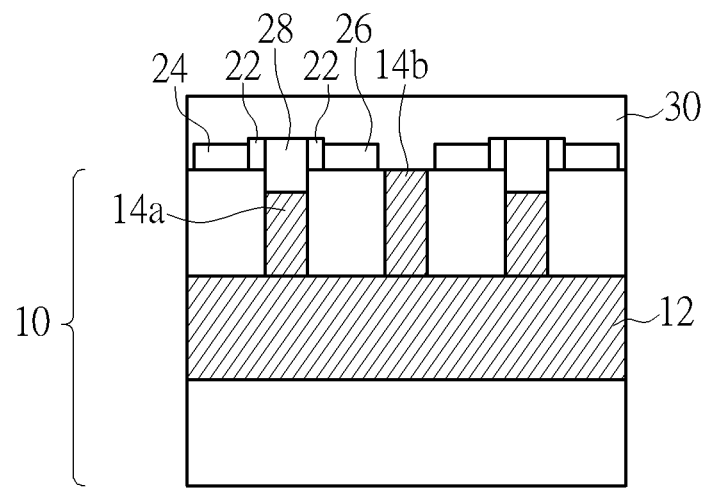

FIG. 10 is a fabricating step continuing from FIG. 9A. After the GAA transistor 100 is formed, an interlayer dielectric 30 is formed to cover the GAA transistor 100. Later, after a planarization, interlayer connections (not shown) can be formed within the interlayer dielectric 30 to couple the GAA transistor 100. The interlayer dielectric 30 could be silicon oxide, silicon nitride and/or their stacks.

Figure 11:
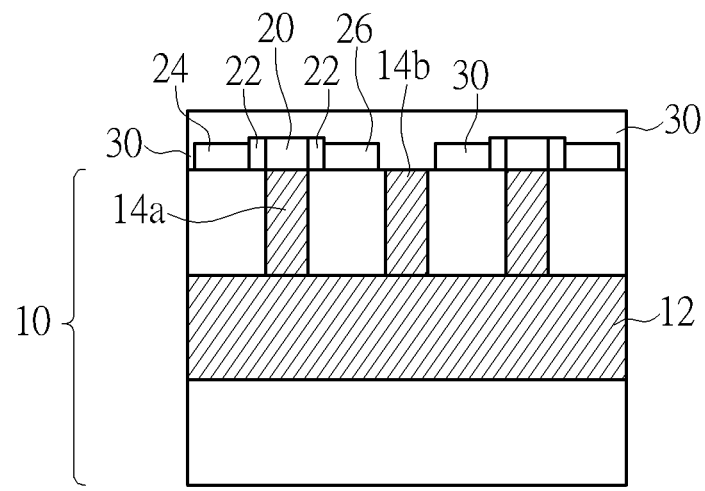
FIG. 11 is a fabricating step in continuous from FIG. 7B according to a third preferred embodiment of the present invention.
Figure 12:
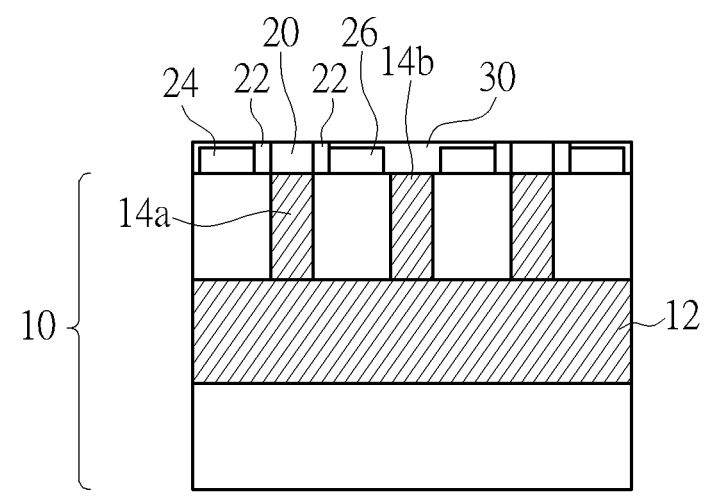
FIG. 12 is a fabricating step in continuous from FIG. 11.
Figure 13:
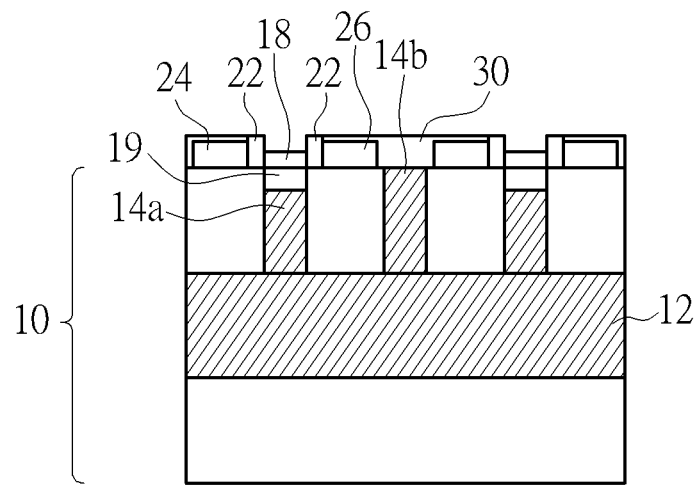
FIG. 13 is a fabricating step in continuous from FIG. 12.
Figure 14:
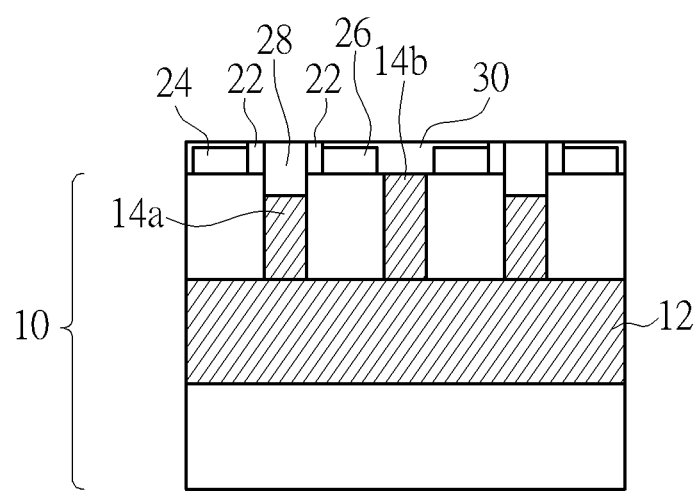
FIG. 14 is a fabricating step in continuous from FIG. 13.

FIG. 11 to FIG. 14 schematically depict a fabricating method of a GAA transistor according to a third preferred embodiment of the present invention, wherein like reference numerals are used to refer to like elements throughout. FIG. 11 is a fabricating step in continuous from FIG. 7B. As shown in FIG. 11, after forming the source electrode 24 and the drain electrode 26, an interlayer dielectric 30 is formed to cover the dummy gate structure 20, the source electrode 24 and the drain electrode 26 and the substrate 10. As shown in FIG. 12, the interlayer dielectric 30 is planarized to expose the dummy gate structure 20. Then, as shown in FIG. 13, the dummy gate structure 20 is removed followed by recessing the first STI 14a. After removing the dummy gate structure 20, a nanowire 18 is exposed and a gap 19 is formed between the nanowire 18 and the first STI 14a. Later, as shown in FIG. 14, a gate structure 28 is formed to wrap the nanowire 18.

FIG. 9A and FIG. 9B depict schematically a GAA transistor fabricated by the first preferred embodiment of the present invention. As shown in FIGS. 9A and 9B, a substrate 10 is provided. A first STI 14a and a second STI 14b are embedded in the substrate 10. The second STI 14b is next to the first STI 14a. It is noteworthy that a top surface of the first STI 14a is lower than a top surface of the substrate 10, and a top surface of the second STI 14b is aligned with the top surface of the substrate 10.

An isolation layer 12 is embedded in the substrate 10, and the isolation layer 12 connects and contacts a bottom surface of the first STI 14a and a bottom surface of the second STI 14b. A nanowire 18 crosses the first STI 14a and disposed on the first STI 14a. A first end 18a and a second end 18b of the nanowire 18 contact the substrate 10, and a middle of the nanowire 18 is above the first STI 14a. Because the nanowire 18 is already wrapped by a gate structure 28 in FIGS. 9A and 9B, please refer to FIG. 4B and FIG. 8B for the positions of the nanowire 18, the first end 18a and the second end 18b. Furthermore, there is no nanowire 18 directly on the second STI 14b.

Figure 7C:
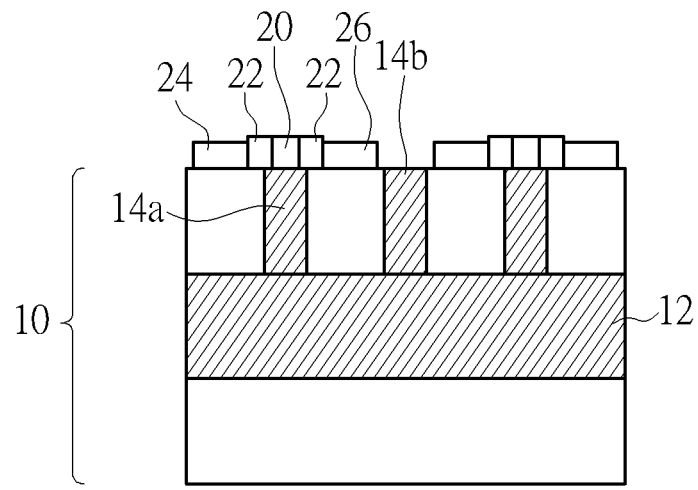

As shown in FIG. 4B, FIG. 8B and FIG. 9B, a source electrode 24 contacts the first end 18a of the nanowire 18, and a drain electrode 26 contacts a second end 18b of the nanowire 18. A gate structure 28 contacts and wraps around the nanowire 18. Two spacers 22 are disposed at two sides of the gate structure 28. In one case, the spacers 22 do not overlap the first STI 14a. However, based on different requirements, as shown in FIG. 7C, the spacers 22 can respectively covers the first STI 14a. The source electrode 24 and the drain electrode 26 contact the substrate 10. The gate structure 28 contacts the top surface of the first STI 14a and part of the gate structure 28 is lower than the top surface of the substrate 10. The length L1 of the gate structure 28 is not greater than a length L2 of the first STI 14a.

According to another preferred embodiment of the present invention, there can be multiple nanowires 18 in one GAA transistor. As shown in FIG. 5, multiple nanowires 18 cross the first STI 14a. The gate structure 28, the source electrode 24 and the drain electrode 26 contact the multiple nanowires 18 in a way similar to single nanowire 18. Therefore, the GAA transistor with multiple nanowires has the same sectional view as that of the GAA transistor 100 with single nanowire as shown in FIG. 9B. As shown in FIG. 9B, the gate structure 28 contacts and wraps around each of the nanowires 18, the source electrode 24 contacts the first end 18a of each of nanowires 18, and the drain electrode 26 contacts a second end 18b of nanowires 18.

Figure 15:
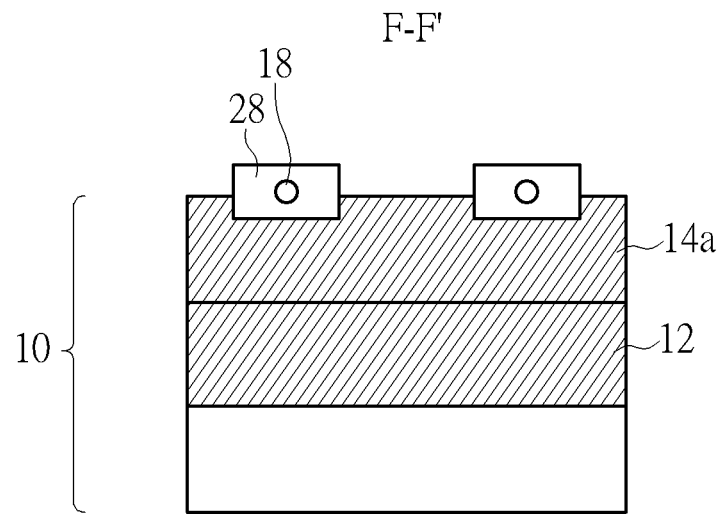
Figure 16:
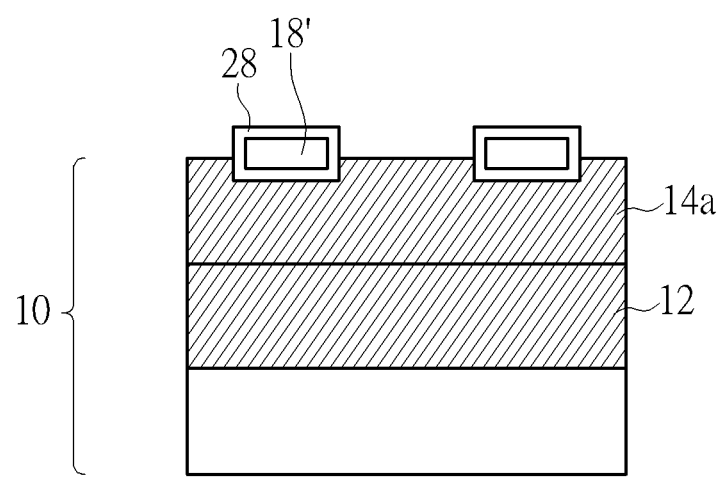

FIG. 15 is a sectional view taken along line F-F' in FIG. 9A. As shown in FIG. 15, the nanowire 18 has a round shape. Moreover, the nanowire 18 or the nanowires 18 mentioned above can be replaced by nanosheets, such as semiconductor nanosheets. FIG. 16 is a varied type of FIG. 15 according to another embodiment. As shown in FIG. 16, the positon of the nanowire 18 is replaced by a nanosheet 18' and the nanosheet 18' has a rectangular shape. Moreover, the cross-section of the nanowire 18 is not limited to the above mentioned shapes, for example, the nanowire 18 can have square, triangular, diamond, or polygon shape.

The substrate 10 may be a semiconductor substrate or an SOI substrate. The semiconductor substrate includes a bulk silicon substrate, a germanium substrate, a gallium arsenide substrate, a silicon germanium substrate, an indium phosphide substrate, a silicon carbide substrate. This embodiment demonstrates the substrate 10 as a semiconductor substrate.

The nanowire 18 can be a semiconductor or a two dimensional material. Similarly, the multiple nanowires 18 can also be a semiconductor or a two dimensional material. The semiconductor includes silicon, silicon germanium, carbon, silicon carbide or other semiconductor materials.

The 2D material includes but is not limited to graphene, silicene, germanene, stanene, black phosphorus, borophene, h-BN, MXenes, transition metal oxides (TM oxides), transitional metal hydroxides, or transition metal dichalcogenide (TMDs). Exemplary transition metal dichalcogenides include, but not limited to, molybdenum disulphide ($MoS_2$), hafnium disulfide ($HfS_2$), zirconium disulfide ($ZrS_2$), tungsten disulfide ($WS_2$), tin sulfide (SnS), or tungsten diselenide ($WSe_2$).

The source electrode 24 and the drain electrode 26 can be metal, alloy or metal compound. For example, the source electrode 24 and the drain electrode 26 may include copper, tungsten, aluminum, tungsten nitride or titanium nitride. The gate structure 28 may include a high-k dielectric and a metal gate. The high-k dielectric layer preferably has a dielectric constant greater than 4, and the material thereof includes rare earth metal oxides or lanthanide oxides. The metal gate may include work function material and gate materials. The work function material could be metal nitrides including but not limited to TiN or TaN. The gate material may include tungsten, titanium, nickel, platinum, aluminum or other metals.

Moreover, a bulk dielectric substrate is not preferred in the method of the present invention. As shown in 8B, the first STI 14a is etched by DHF. The lateral etching is stopped by the substrate 10 because the substrate 10 is a semiconductor. In the case of the bulk dielectric substrate, the lateral etching can't be stopped because DHF can also etch the bulk dielectric substrate. In other words, the etching selection ratio with respective to DHF between the STI and the bulk dielectric substrate is not large enough.

The fabricating method of the present invention provides an easier way to form a GAA transistor. A conventional method for manufacturing nanowires needs to form an alternative Si/SiGe stack first. Then, the Si/SiGe stack is etched to form fins. After a gate is formed on the fins, inner spacers need to be formed between Si and SiGe. Finally, SiGe is removed from the Si/SiGe stack to form nanowires. Therefore, the conventional method is more complicated and has more fabricating steps than the method of the present invention. Furthermore, the inner spacer formation is hard to control and may introduce a lot of variations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A GAA transistor, comprising:
a semiconductor substrate;
a first shallow trench isolation (STI) embedded in the semiconductor substrate, wherein a top surface of the first STI is lower than a top surface of the semiconductor substrate;
a nanowire crossing the first STI and disposed on the first STI;
a gate structure contacting and wrapping around the nanowire;
a source electrode contacting a first end of the nanowire; and
a drain electrode contacting a second end of the nanowire.

2. The GAA transistor of claim 1, further comprising a plurality of the nanowires parallel to each other and crossing the first STI, wherein the gate structure contacts and wraps around each of the plurality of the nanowires, the source electrode contacts a first end of each of the plurality of nanowires, and the drain electrode contacts a second end of each of the plurality of nanowires.

3. The GAA transistor of claim 1, wherein the source electrode and the drain electrode contact the semiconductor substrate.

4. The GAA transistor of claim 1, wherein the gate structure contacts the top surface of the first STI and part of the gate structure is lower than the top surface of the semiconductor substrate.

5. The GAA transistor of claim 1, wherein a length of the gate structure is not greater than a length of the first STI.

6. The GAA transistor of claim 1, further comprising a second STI embedded in the semiconductor substrate and next to the first STI, wherein there is no nanowire directly on the second STI, and a top surface of the second STI is aligned with the top surface of the semiconductor substrate.

7. The GAA transistor of claim 1, further comprising a silicon oxide layer embedded in the semiconductor substrate, and the silicon oxide layer connecting and contacting a bottom surface of the first STI and a bottom surface of the second STI.

8. The GAA transistor of claim 1, further comprising two spacers disposed at two sides of the gate structure.

9. The GAA transistor of claim 8, wherein the spacers do not fully overlap the first STI.

10. The GAA transistor of claim 1, wherein the nanowire comprises a semiconductor or a two dimensional material.

11. The GAA transistor of claim 10, wherein the nanowire comprises a transition metal dichalcogenide, graphene, silicon or silicon germanium.

12. The GAA transistor of claim 1, wherein the first end and the second end of the nanowire contact the semiconductor substrate, and a middle section of the nanowire is above the first STI.

13. A fabricating method of a GAA transistor, comprising:
providing a semiconductor substrate with a first shallow trench isolation (STI) and a second STI embedded therein, wherein the first STI is parallel to the second STI and the first STI is next to the second STI;
forming a material layer contacting the semiconductor substrate, the first STI and the second STI;
patterning the material layer to form a nanowire crossing the first STI and disposed on the first STI and to remove the material layer on the second STI;
forming a dummy gate structure and two spacers at two sides of the dummy gate structure, wherein the dummy gate structure and the two spacers cross and contact the nanowire, and the dummy gate structure and the two spacers entirely overlap the first STI;
forming a source electrode and a drain electrode, wherein the source electrode contacts a first end of the nanowire, and the drain electrode contacts a second end of the nanowire;
removing the dummy gate structure and exposing the first STI;
recessing the first STI to make a top surface of the first STI lower than a top surface of the semiconductor substrate, wherein while recessing the first STI, the second STI is not recessed; and
forming a gate structure contacting and wrapping around the nanowire.

14. The fabricating method of the GAA transistor of claim 13, wherein while patterning the material layer, a plurality of the nanowires are formed.

15. The fabricating process of the GAA transistor of claim 13, further comprising before forming the first STI and the second STI, forming a silicon oxide layer in the semiconductor substrate by an ion implantation process.

16. The fabricating method of the GAA transistor of claim 13, further comprising after forming the gate structure, forming an interlayer dielectric covering the semiconductor substrate.

17. The fabricating method of the GAA transistor of claim 13, further comprising after forming the source electrode and the drain electrode and before removing the dummy gate structure, forming an interlayer dielectric covering the semiconductor substrate.

18. The fabricating method of the GAA transistor of claim 13, wherein the nanowire comprises a transition metal dichalcogenide or graphene.

19. The fabricating method of the GAA transistor of claim 13, wherein after recessing the first STI, the first end and the second end of the nanowire contact the semiconductor substrate, and a middle of the nanowire is above the first STI.

20. The fabricating method of the GAA transistor of claim 13, wherein the semiconductor substrate comprises a silicon on insulator substrate or a semiconductor substrate.

* * * * *